US012765314B2

(12) United States Patent
Williams et al.

(10) Patent No.: US 12,765,314 B2
(45) Date of Patent: Oct. 13, 2026

(54) CARRIER FOR PANELS

(71) Applicant: Yield Engineering Systems, Inc., Fremont, CA (US)

(72) Inventors: Matthew Williams, Los Angeles, CA (US); Hunter Braverman, Newbury Park, CA (US); Hratch Mouradian, Porter Ranch, CA (US); Sossan Wali, Moorpark, CA (US); Bob Hanopulus, Chatsworth, CA (US); Al Stone, Bloomingale, IL (US)

(73) Assignee: Yield Engineering Systems, Inc., Fremont, CA (US)

( * ) Notice: Subject to any disclaimer, the term of this patent is extended or adjusted under 35 U.S.C. 154(b) by 621 days.

(21) Appl. No.: 18/238,647

(22) Filed: Aug. 28, 2023

(65) Prior Publication Data

US 2025/0079213 A1 Mar. 6, 2025

(51) Int. Cl.
*H10P 72/10* (2026.01)
*B65D 43/12* (2006.01)
*B65D 85/48* (2006.01)

(52) U.S. Cl.
CPC .............. *H10P 72/17* (2026.01); *B65D 43/12* (2013.01); *B65D 85/48* (2013.01)

(58) Field of Classification Search
CPC .. H10P 72/17; H10P 72/1914; H10P 72/1921; B65D 43/12; B65D 85/48; G11B 23/0236; Y10T 29/53291
See application file for complete search history.

(56) References Cited

U.S. PATENT DOCUMENTS

| | | | | | |
|---|---|---|---|---|---|
| 4,697,704 | A | * | 10/1987 | Curry ................. | G11B 33/0433 206/454 |
| 4,929,861 | A | * | 5/1990 | Metcalf .............. | G11B 23/0236 292/205 |
| 5,593,032 | A | | 1/1997 | Staley | |
| 6,129,237 | A | * | 10/2000 | Miyahara ............. | B65D 43/165 220/255 |

(Continued)

FOREIGN PATENT DOCUMENTS

| | | |
|---|---|---|
| CN | 1807199 A | 7/2006 |
| EP | 0205618 B1 | 7/1991 |
| WO | WO 2003/009298 A1 | 1/2003 |

OTHER PUBLICATIONS

International Search Report and Written Opinion in International Application No. PCT/US2024/034715, mailed on Aug. 20, 2024, 13 pages.

*Primary Examiner* — Donghai D Nguyen
(74) *Attorney, Agent, or Firm* — Fish & Richardson P.C.

(57) ABSTRACT

A carrier configured to support multiple panels includes a housing having a pair of opposing sidewalls extending in a first direction and a plurality of trays stacked between the pair of opposing sidewalls in the first direction. A lid is slidably coupled to the pair of opposing sidewalls and configured to be slid on the housing between an open configuration and a closed configuration. The plurality of trays are supported in the housing such that, in the closed configuration of the lid, two trays of the plurality of trays are blocked from moving relative to one another in the first direction, and in the open configuration of the lid, the two trays are configured to be moved relative to one another in the first direction.

17 Claims, 17 Drawing Sheets

(56) References Cited

U.S. PATENT DOCUMENTS

| | | | | |
|---|---|---|---|---|
| 6,669,023 | B2 * | 12/2003 | Kikuchi | B42F 7/145 206/307 |
| 7,344,031 | B2 * | 3/2008 | Hasegawa | H10P 72/1912 206/454 |
| 2005/0067359 | A1 | 3/2005 | Caplan et al. | |

* cited by examiner

CARRIER FOR PANELS

TECHNICAL FIELD

The present disclosure relates to a carrier for transporting fragile panels through semiconductor processing steps.

BACKGROUND

In semiconductor processing, the handling and transportation of glass panels require specialized carriers to ensure the protection and integrity of the fragile glass panels. These carriers are designed to securely hold the glass panels during various manufacturing steps while preventing damage and contamination. The carriers must be designed to withstand exposure to various chemicals used during processing and maintain a controlled environment to prevent contamination. Conventional carriers are capable of supporting only a small number of panels and may cause excessive breakage and damage to the panels. Moreover, some conventional carriers cannot be used to support the panels during multiple chemical processes without switching carriers. The disclosed carriers may be used to load, carry, handle, and unload multiple thin glass panels through a multitude of chemical processes from room temperature through high temperatures (for example, about 135° C.) in a safe, effective, and automated manner.

SUMMARY

Embodiments of a carrier and related apparatus to support substrates during one or more chemical processing operations are disclosed.

In one embodiment, a carrier configured to support multiple panels and expose the multiple panels to one or more chemical processes is disclosed. The carrier may include a housing having a pair of opposing sidewalls extending in a first direction. A plurality of trays may be stacked between the pair of opposing sidewalls along the first direction, wherein each tray of the plurality of trays is configured to support a panel of the multiple panels thereon. A lid may be slidably coupled to the pair of opposing side-walls and may be configured to be slid on the housing between an open configuration and a closed configuration. The plurality of trays may be supported in the housing such that (a) in the closed configuration of the lid, two trays of the plurality of trays are blocked from moving relative to one another in the first direction, and (b) in the open configuration of the lid, the two trays are configured to be moved relative to one another in the first direction.

In yet another embodiment, a system for automatically loading panels on a carrier is disclosed. The system may include a carrier and a tilter mechanism. The carrier may include a housing having a pair of opposing sidewalls extending in a first direction. A plurality of trays may be stacked between the pair of opposing sidewalls in the first direction. Each tray of the plurality of trays may be configured to support a panel thereon. A lid may be coupled to the pair of opposing sidewalls and may be configured to be slid on the housing in a second direction transverse to the first direction between an open configuration and a closed configuration. The plurality of trays may be supported in the housing such that (a) in the closed configuration of the lid, two trays of the plurality of trays are blocked from moving relative to one another in the first direction, and (b) in the open configuration of the lid, the two trays are configured to be moved relative to one another in the first direction. The tilter mechanism may be configured to slide the lid of the carrier between its open and closed configuration. The tilter mechanism may also be configured to, in the open configuration of the lid, move a first tray of the plurality of trays of the carrier in the first direction relative to a second tray below the first tray and load a panel of the plurality of panels in the second tray.

BRIEF DESCRIPTION OF THE DRAWINGS

The accompanying drawings, which are incorporated herein and constitute a part of this disclosure, illustrate exemplary embodiments and, together with the description, are used to explain the disclosed principles. In these drawings, where appropriate, reference numerals that illustrate the same or similar structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, features in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing dimensions or proportional relationships between different features in a figure. Additionally, even if it is not expressly mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another degree of variation is specified). For example, a feature disclosed as being about "t" units wide (or length, thickness, depth, etc.) may vary in width from (t−0.1t) to (t+0.1t) units. In some cases, the specification also provides context to some of the relative terms used. For example, structures described as being substantially parallel may deviate by ±10% from being perfectly parallel. Further, a range described as varying from, or between, 5 to 10 (5-10), includes the endpoints also (i.e., 5 and 10).

Figure 3A:
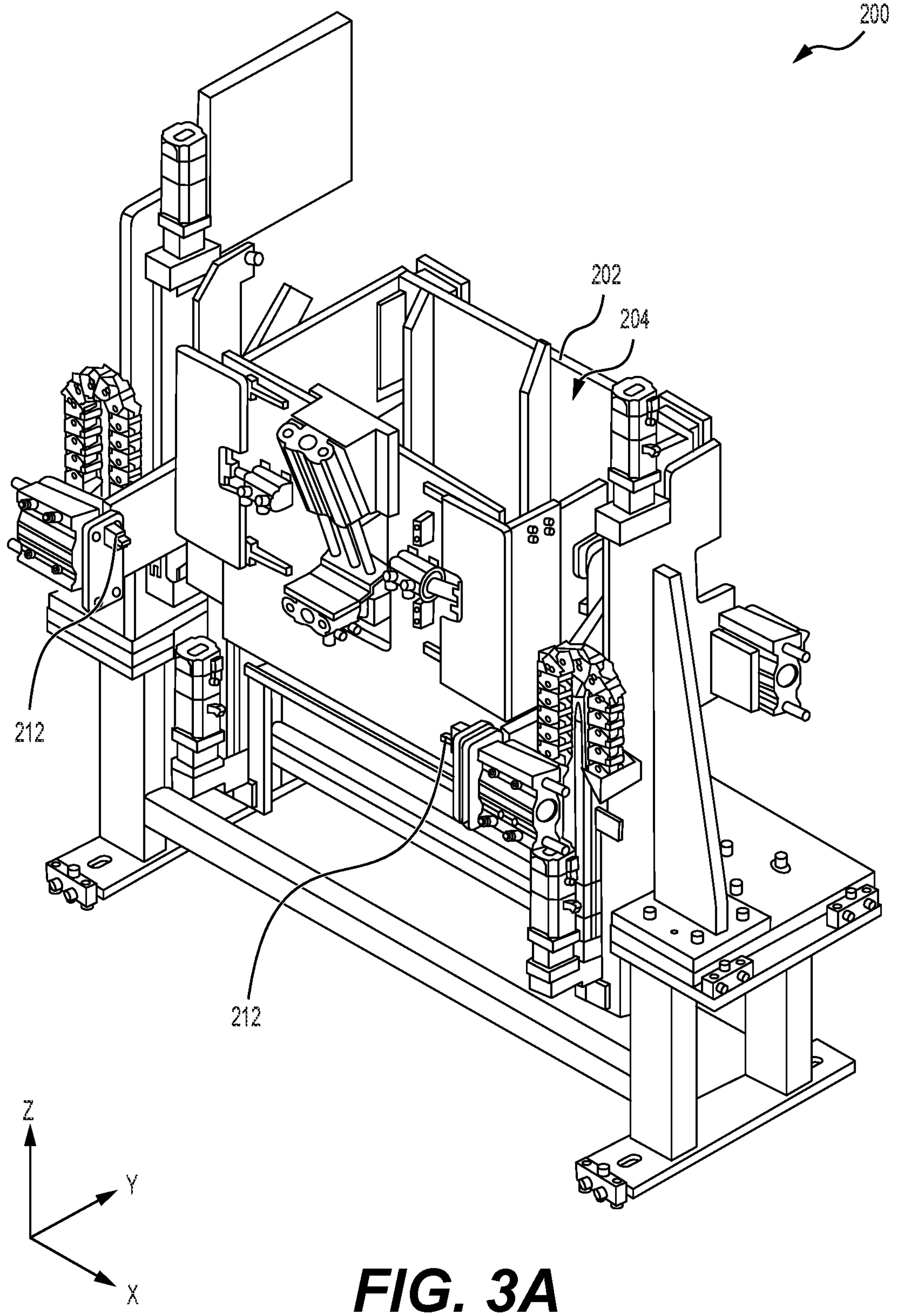
FIGS. 3A-3D illustrate different views of an exemplary tilter mechanism that may be used with the carrier of FIG. 1A.
Figure 3B:
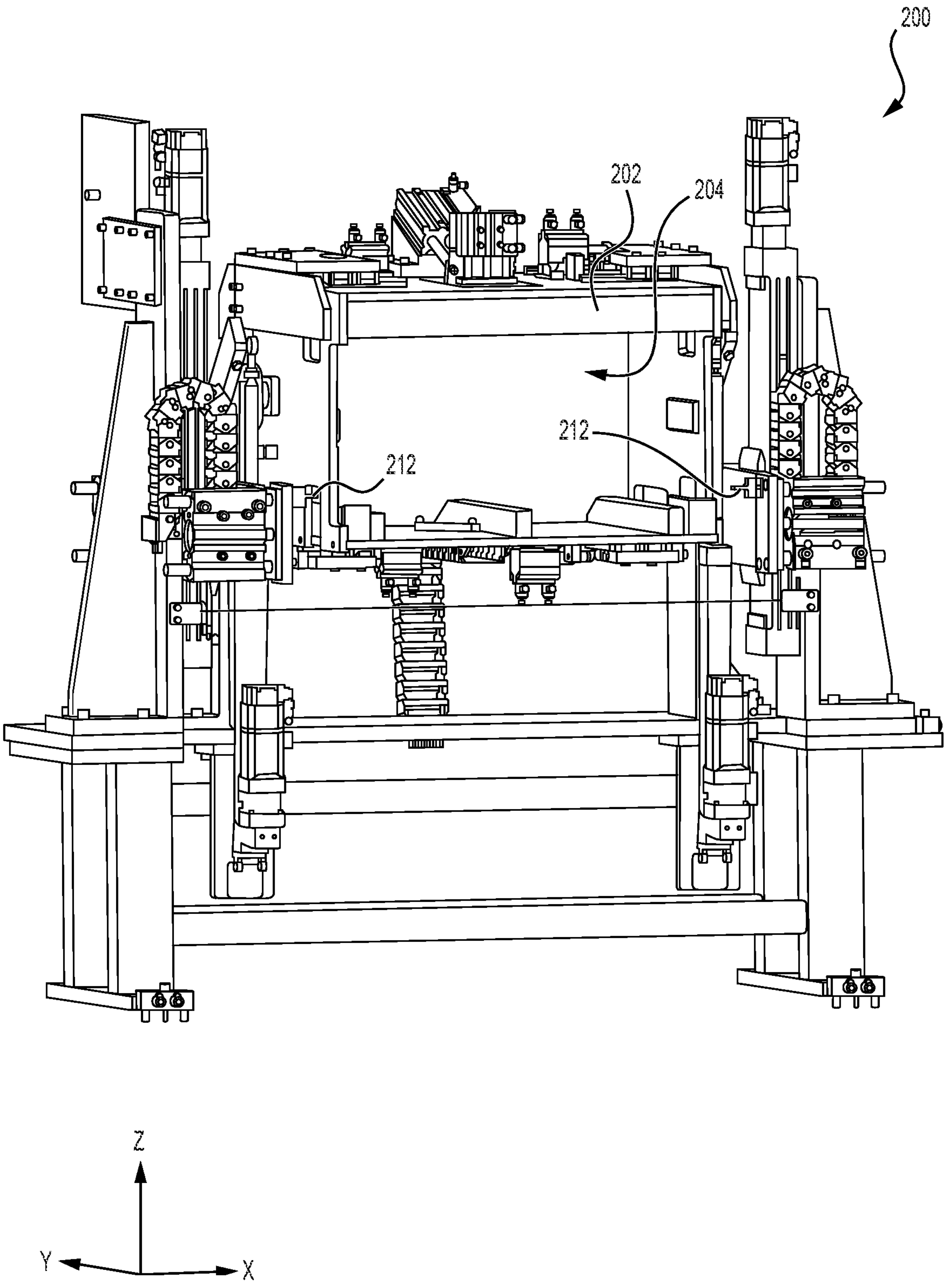
Figure 3C:
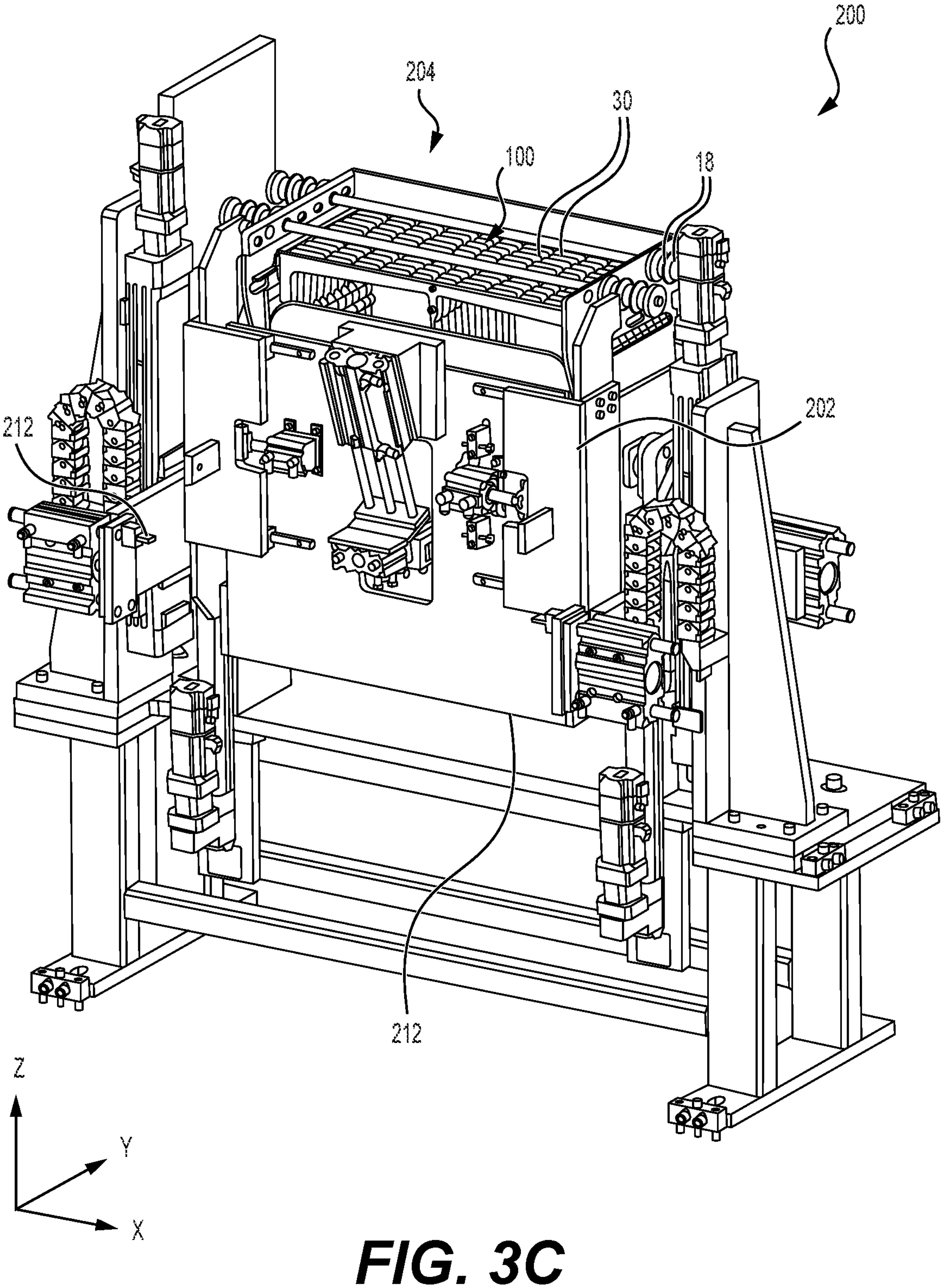
Figure 3D:
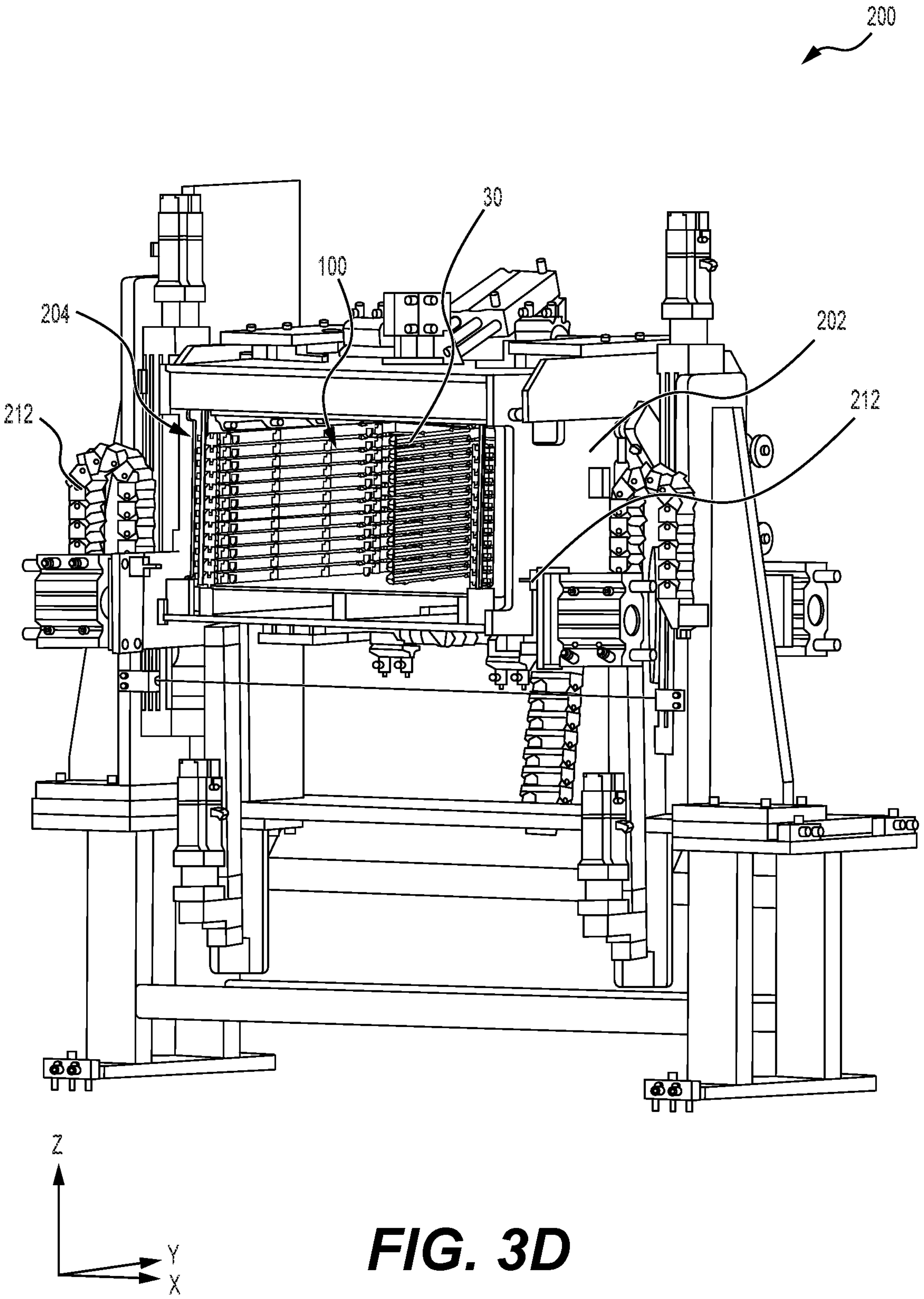

Terms indicating orientation, such as, for example, "top," "bottom," "side," etc., are used with reference to the orientation being discussed and are used solely for the sake of convenience (e.g., ease of description). A surface (end or structure) referred as, for example, the top surface of an object (e.g., the carrier) when discussing a figure showing the carrier in one orientation may not be a surface at the top of the carrier (i.e., a "top" surface) in a different orientation of the carrier. For example, FIGS. 1A-1H show a carrier 100 in a horizontal configuration. In this configuration, lid 20 may be described as forming a top surface of carrier 100 and sidewalls 14 may be described as forming its side surfaces. However, in the vertical orientation of the carrier (for example, illustrated in FIG. 3C), both lid 20 and sidewalls 14 form the side surfaces of carrier 100. Similarly, terms indicating direction (e.g., vertical direction, horizontal direction, etc.) are also used with reference to the orientation being discussed and are used solely for the sake of convenience. For example, a direction described as the vertical direction (e.g., direction along the Y-axis in FIG. 1A) with reference to one orientation may be a horizontal direction in another orientation (see, e.g., FIG. 3C).

Unless otherwise defined, all terms of art, notations, and other scientific terms or terminology used herein have the same meaning as commonly understood by persons of ordinary skill in the art to which this disclosure belongs. Some components, structures, and/or processes described or referenced herein are well understood and commonly employed using conventional methodology by those skilled in the art. These components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in references incorporated by reference. None of the references described or referenced herein is admitted as prior art relative to the current disclosure.

The discussion below describes an exemplary carrier configured to support a plurality of panels during one or more chemical processes. The term "panel" is used broadly to refer to any type of unprocessed, processed, or semi-processed substrate used in semiconductor or opto-electronic fabrication. It should be noted that although a carrier configured to support rectangular panels is described, this is only exemplary. Aspects of the current disclosure may be used to support any type of substrate having any configuration (e.g., circular, square, rectangular, or another suitable shape) made of any material (semiconductor, glass, metal, plastic, etc.).

FIGS. 1A-1H illustrate different views of an exemplary carrier 100 of the current disclosure. In the description below, reference will be made to all of these figures. Carrier 100 is configured to support and retain therein a plurality of panels during one or more chemical processing steps of, for example, semiconductor fabrication. In other words, carrier 100 may be used to support multiple panels in one or more chemical processing stations. For example, in some embodiments, carrier 100 (with the panels therein) may be transported between different chemical processing stations to sequentially subject the panels in the carrier to different chemical processes. As explained previously, the panels may, in general, have any configuration and may be made of any material. In some embodiments, the panels may be thin rectangular glass panels. The panels in the carrier may be subjected to any type of chemical process (e.g., cleaning, chemical etching, electroplating, electroless plating, etc.). In some of these processes, the carrier with the panels may be submerged in a liquid chemical, for example, in a bath.

Figure 1A:
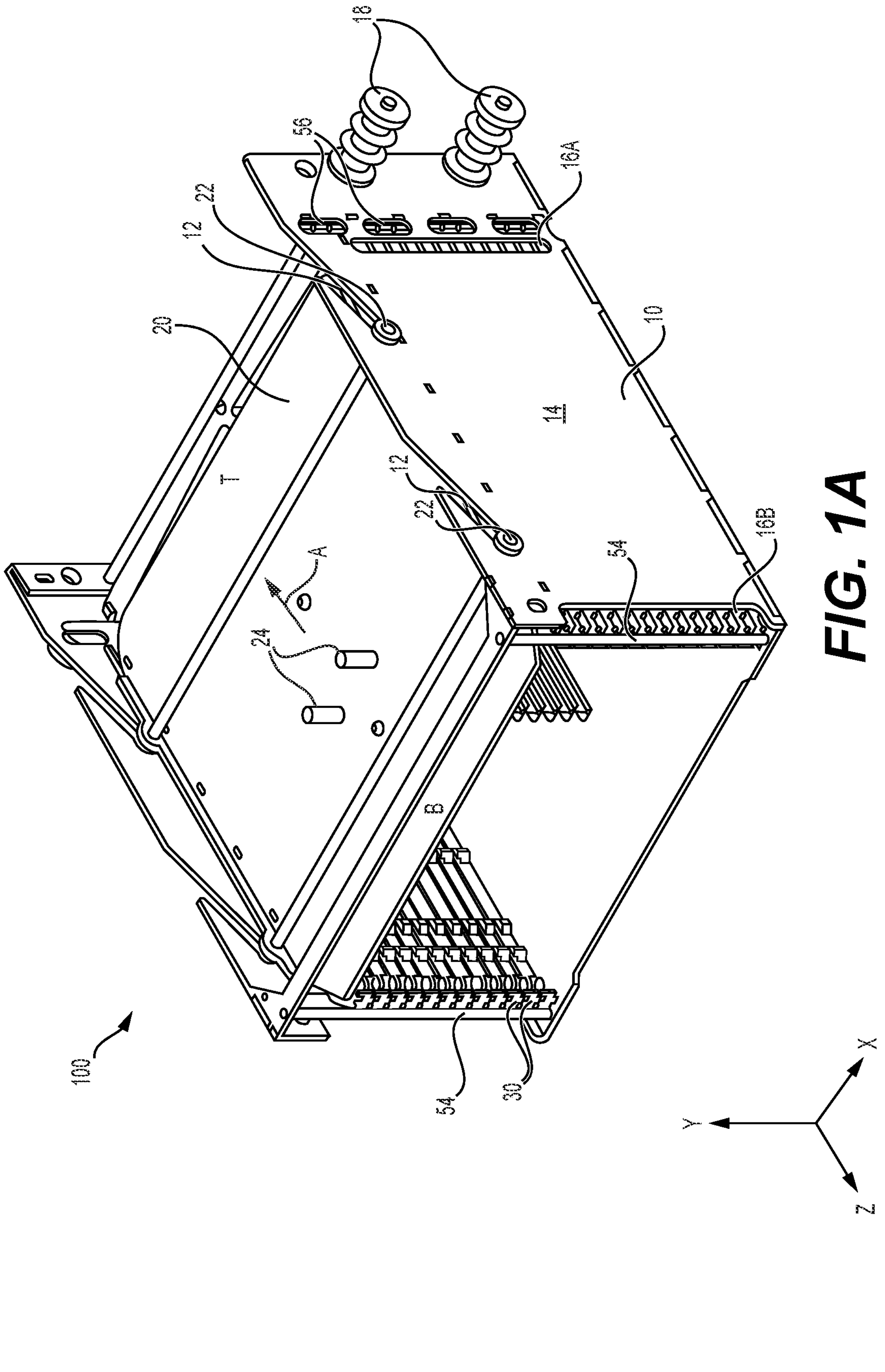
FIGS. 1A-1H illustrate different views of an exemplary carrier of the current disclosure.
Figure 1B:
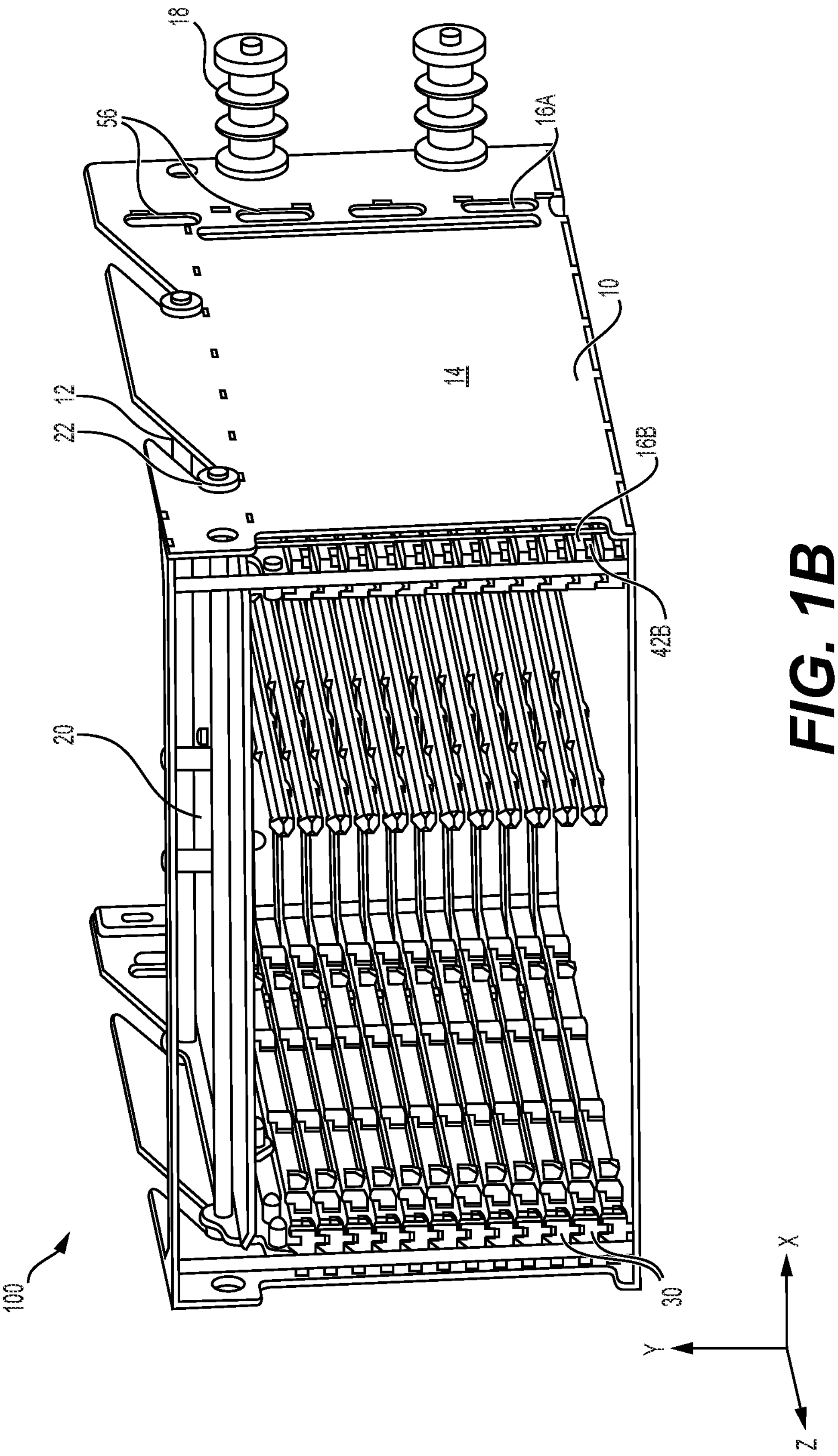
Figure 1C:
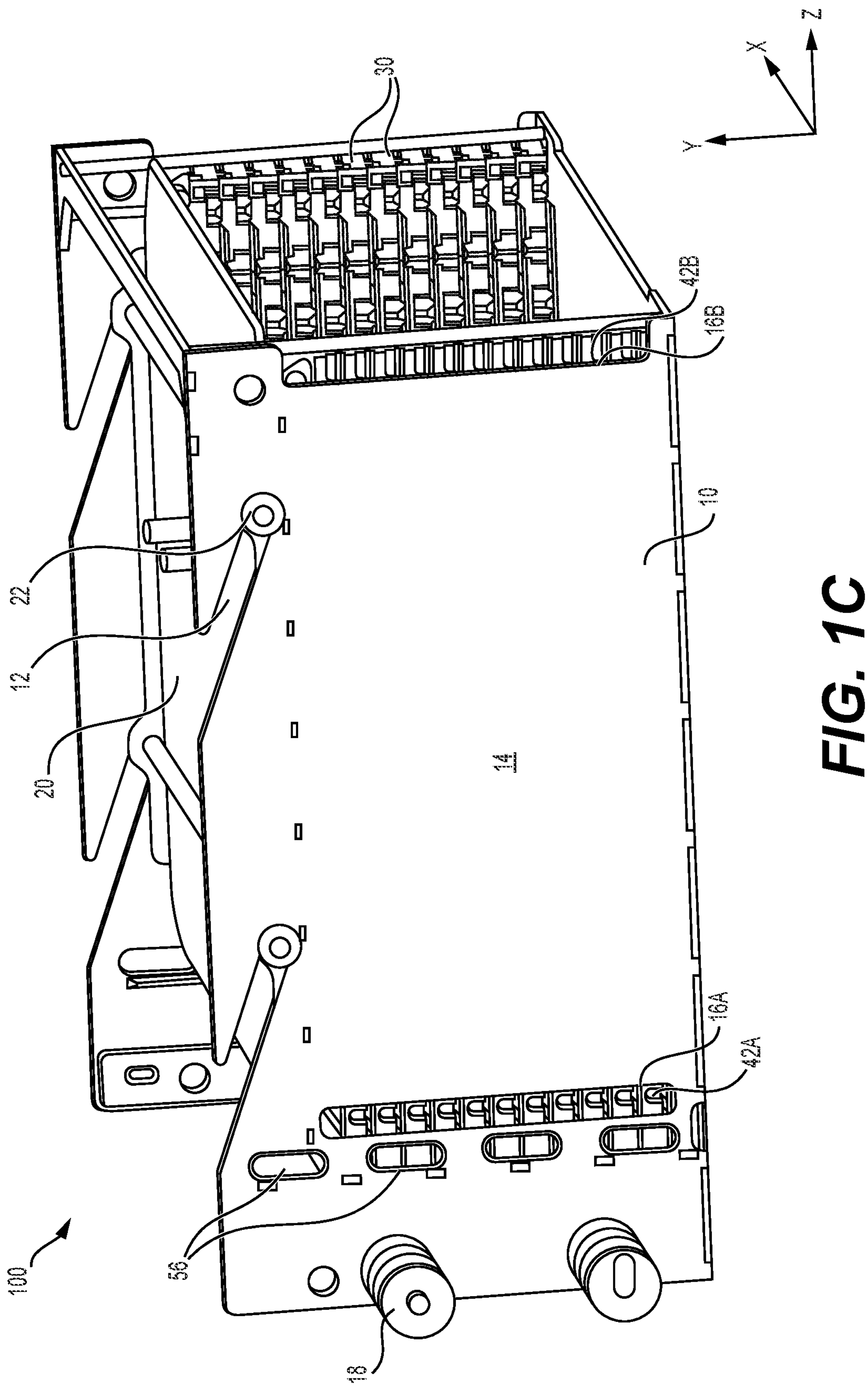
Figure 1D:
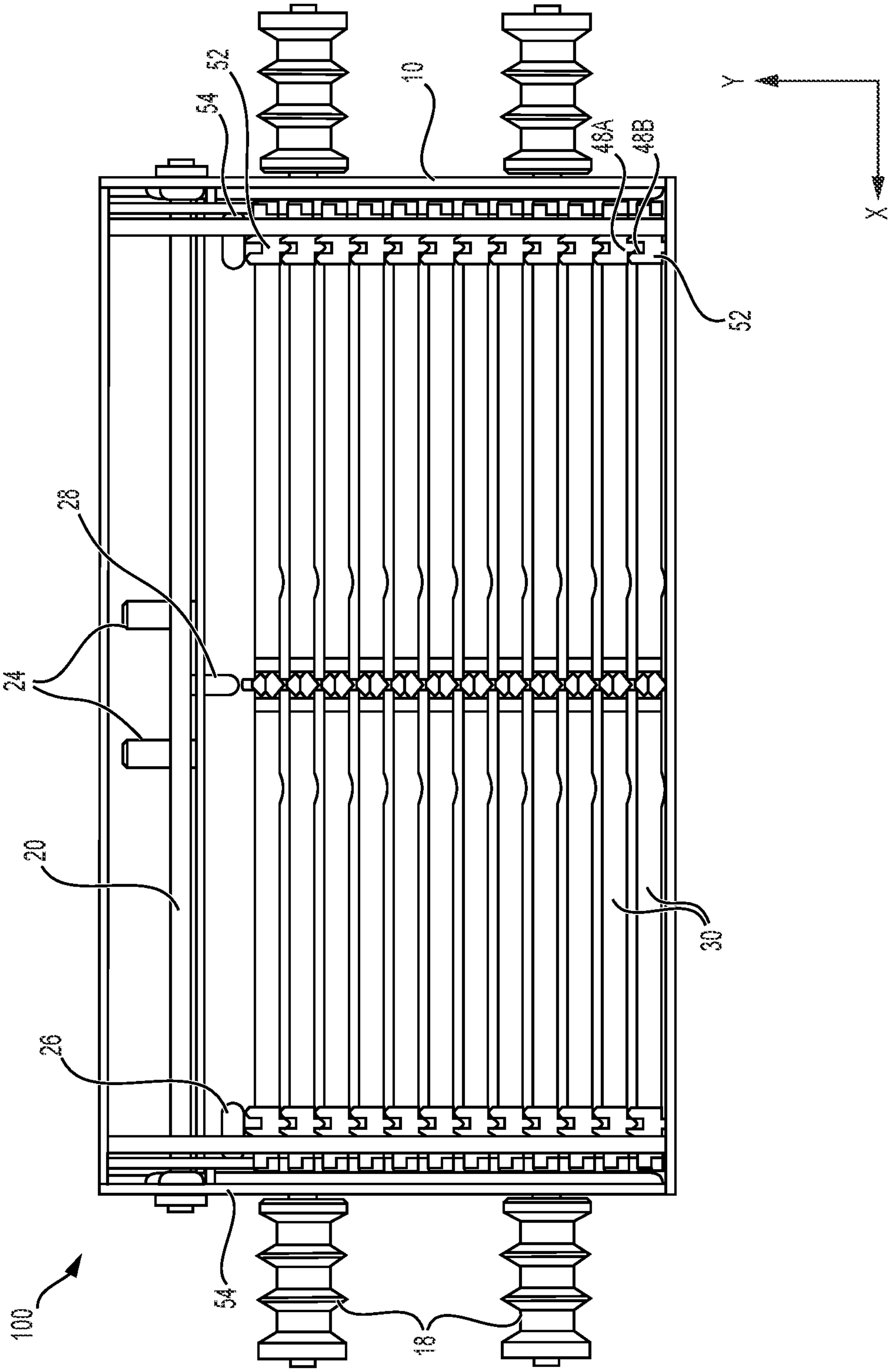

The outer structure of carrier 100 includes a housing 10 and a lid 20 slidably supported on housing 10. Housing 10 and lid 20 may have any size and shape. Typically, their size and shape may be dictated by the size, shape, and number of the panels that will be supported in carrier 100. Lid 20 is configured to slide on housing 10 between an open configuration (see, e.g., FIGS. 1E-1G) and a closed configuration (see, e.g., FIGS. 1A-ID). With specific reference to FIGS. 1A and 1C, pins 22 connected to lid 20 are disposed (or retained) in inclined slots 12 on opposite sidewalls 14 of housing 10 to slidably couple the lid 20 to housing 10. With reference to FIGS. 1B and 1F, moving the lid 20 horizontally (e.g., in the −Z direction) with respect to housing 10 causes the pins 22 to slide up the inclined slots 12 and move (e.g., slide) the lid 20 to its open configuration. Lid 20 remains in its closed configuration due to gravity. To move lid to the open configuration, lid 20 may be slid in the direction of arrow A (see FIG. 1A) (i.e., in the −Z direction). When the lid moves in this direction, pins 22 may slide up the inclined slots 12 and transform lid 20 to its open configuration. In some embodiments, as will be described in more detail later, a tilter mechanism (referred to herein as a tilter 200) associated with carrier 100 may be used to open lid 20 (for example, to move pins 24 in the direction of arrow A to open the lid).

Figure 4:
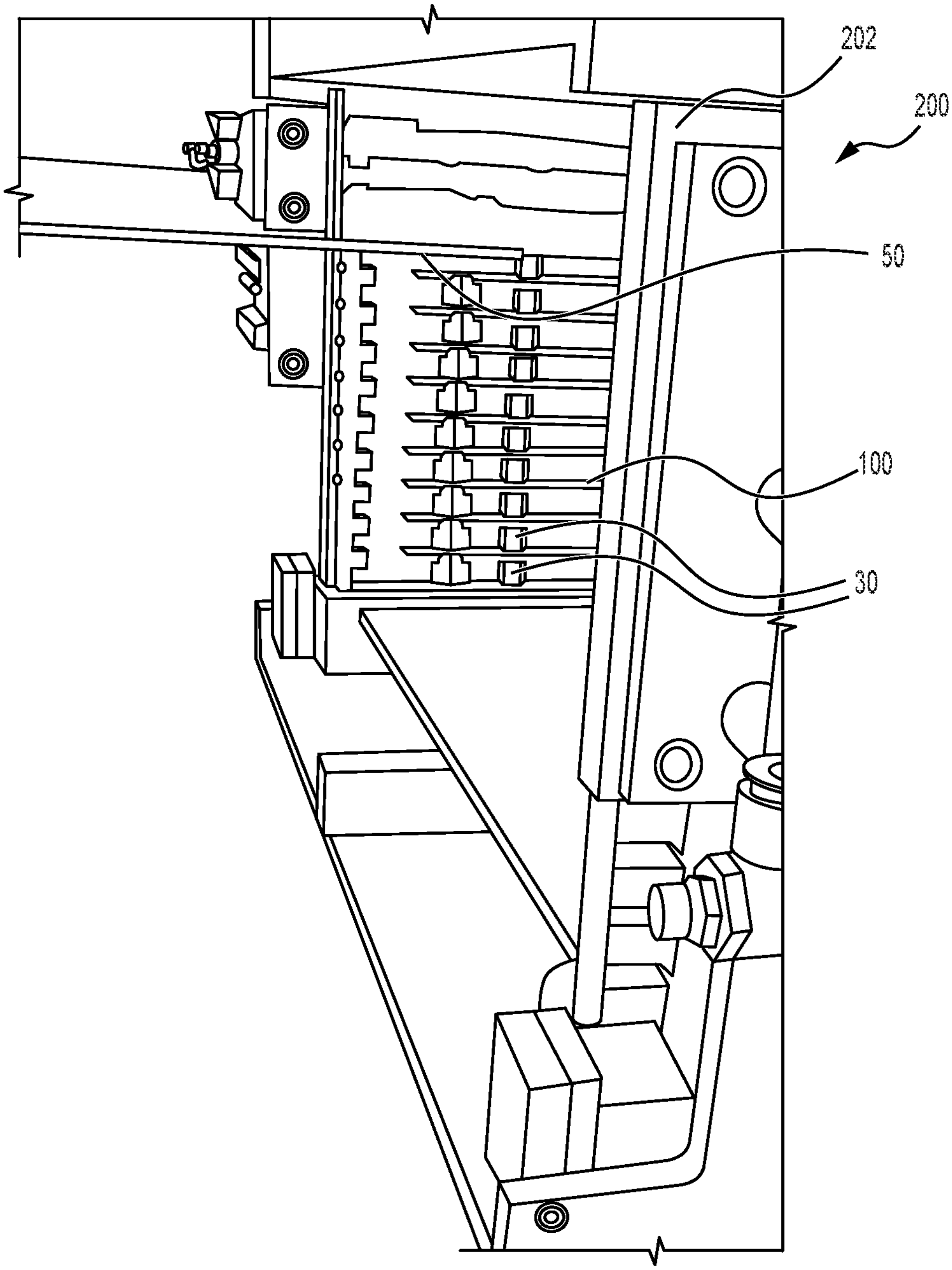
FIG. 4 is an illustration showing loading of an exemplary panel on the carrier of FIG. 1A.

In general, housing 10 and lid 20 may be made of any material that can withstand the environment of the one or more chemical processes that the panels will be exposed or subjected to. In other words, the materials used to form housing 10 and lid 20 may be adapted to withstand the chemicals and temperatures that the panels will be exposed to during chemical processing in carrier 100. In some embodiments, one or both of housing 10 and lid 20 may be formed from polyfluoroalkyl (PFA) coated grade 2 titanium. Multiple trays 30 are provided within housing 10 of carrier 100. Each of these trays 30 is configured to support a panel 50 thereon (see, e.g., FIG. 4). The material used to form tray 30 may also be adapted to withstand the chemicals and temperatures during chemical processing. In some embodiments, tray 30 may be formed out of PTFE (Polytetrafluoroethylene). In some embodiments, tray 30 may include titanium stiffening skeletons embedded within a PTFE body for structural stability. The PFA and PTFE used in carrier 100 may be resistant to the chemicals used in the chemical processes that the panels are subjected to. However, these materials are merely exemplary, and the housing, lid, and carrier may be made of any suitable material.

In general, carrier 100 may include any number of trays 30. The number of trays 30 may depend, for example, on the desired number of panels to be processed simultaneously. In the exemplary embodiment illustrated, for example, in FIGS. 1A-1H, carrier 100 includes twelve trays 30, and each tray 30 is configured to support a single panel 50 thereon. Within housing 10, trays 30 are stacked on top of each other and are retained in place by locating features on each tray 30 and housing 10. Carrier 100 is configured such that the trays 30 can be lifted or separated from each other in the vertical direction (i.e., along the Y-axis in the orientation of FIG. 1A) when housing 10 is in the horizontal position (illustrated in, e.g., FIGS. 1A-1G) and lid 20 is in its open configuration. Before a tray 30 can be lifted, lid 20 is opened to allow space for the trays to move vertically up and down within housing 10 (see, e.g., FIGS. 1F-1G). When lid 20 is in the closed position, trays 30 are retained or locked in place and cannot be moved or separated from each other (see, e.g., FIG. 1B). In other words, to separate the trays from each other (in the vertical direction), the lid 20 will have to be opened. When lid 20 is closed, the multiple trays 30 in carrier 100 are locked in place.

Figure 1E:
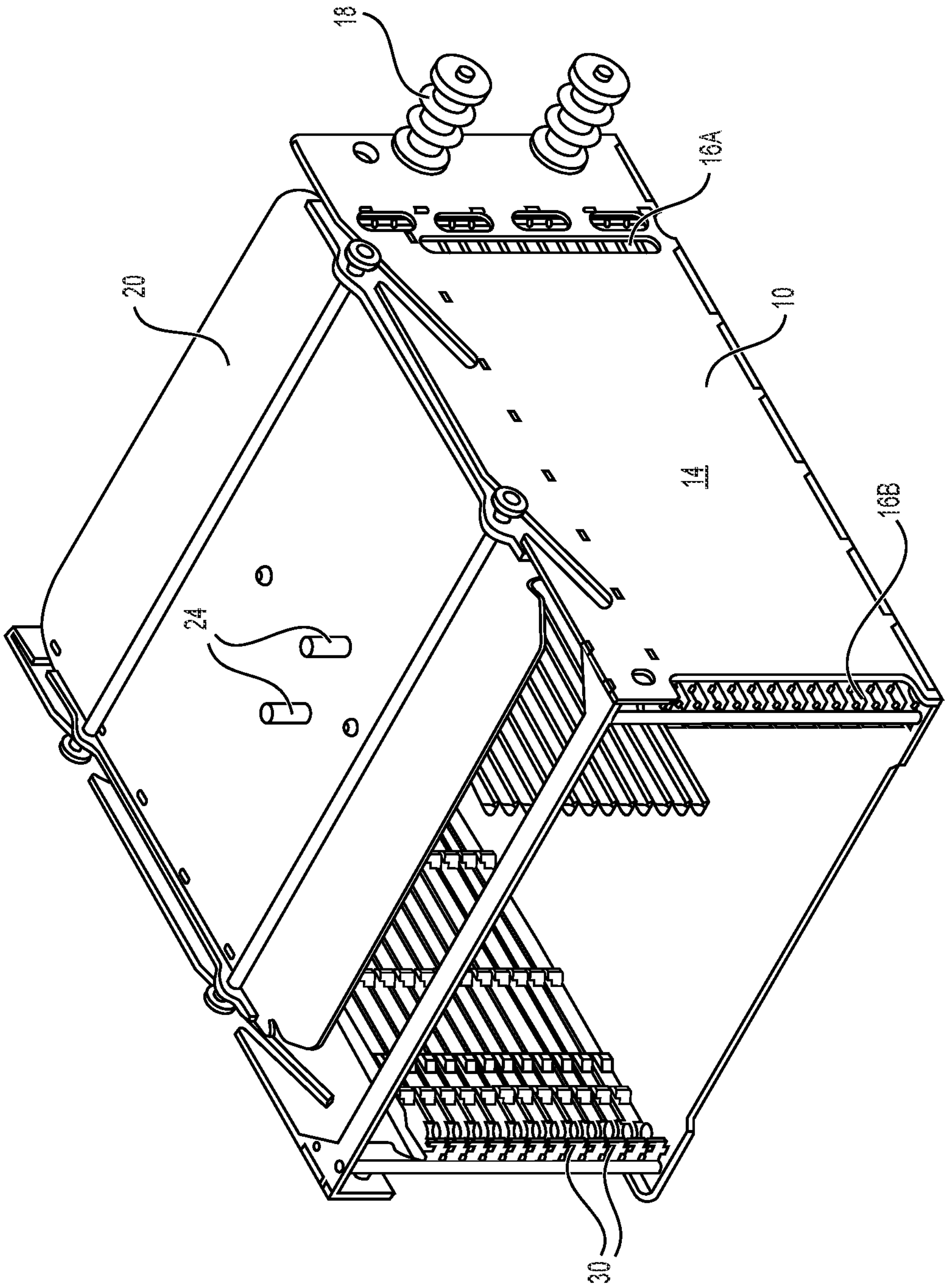
Figure 1F:
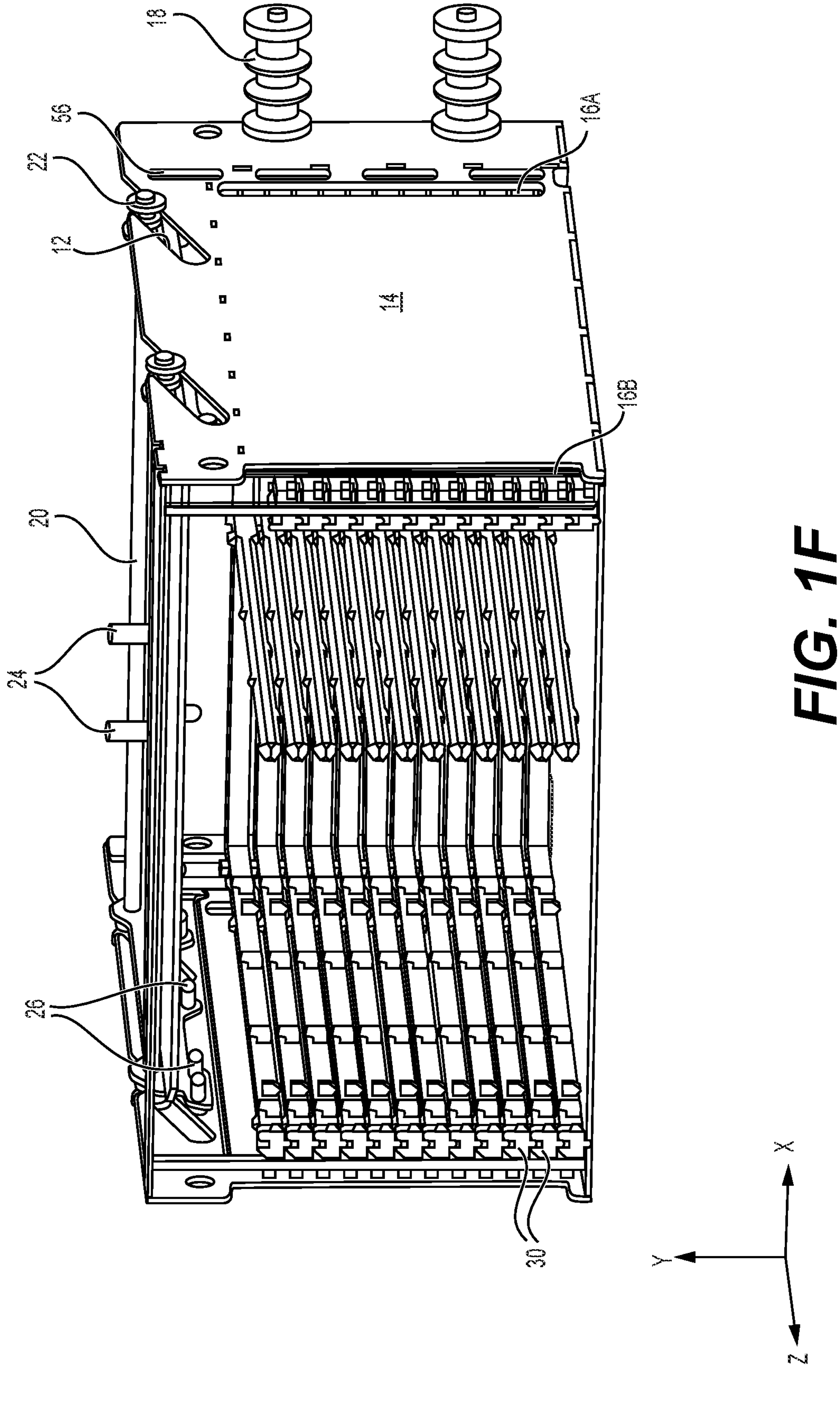
Figure 1G:
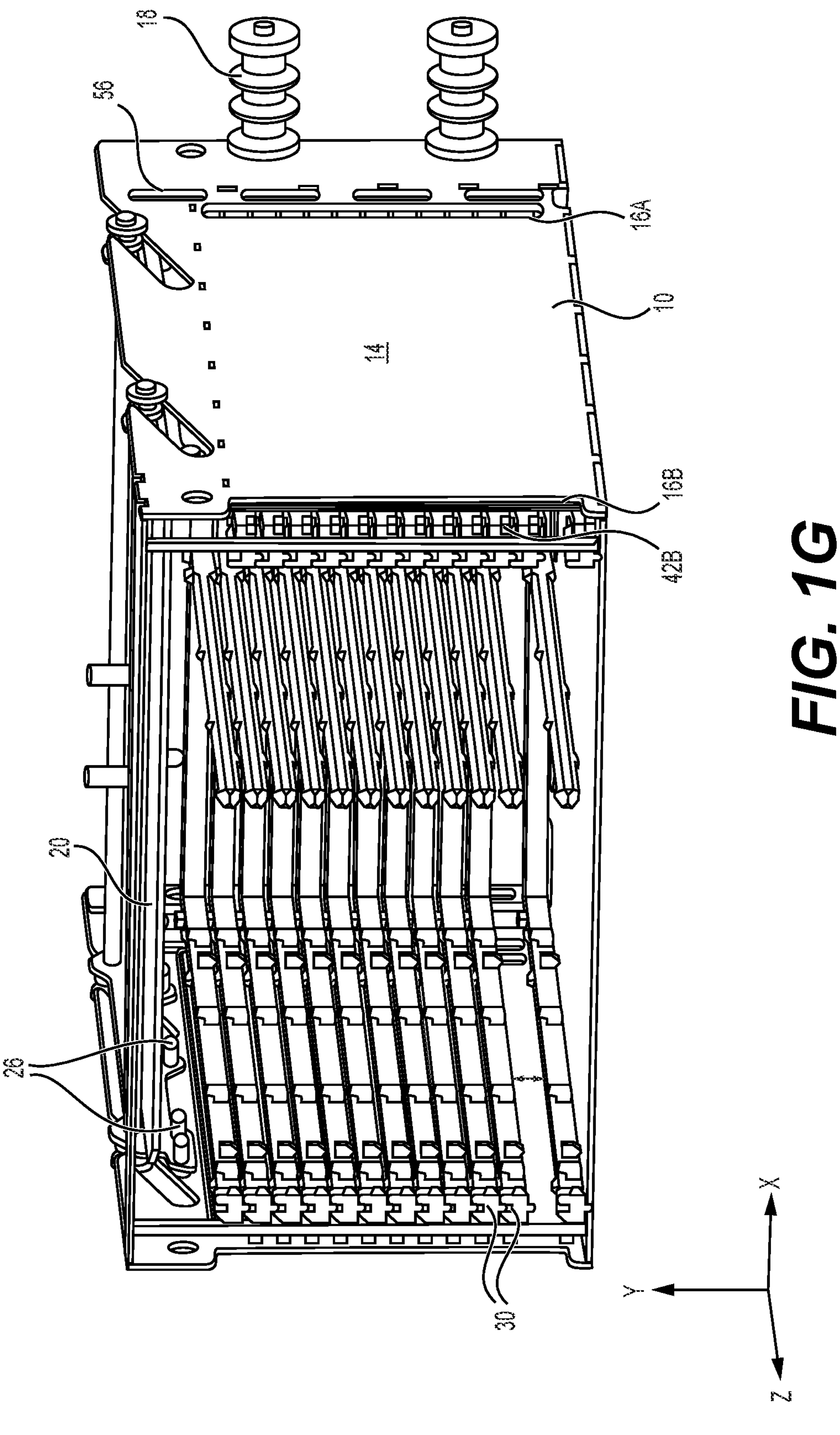

Prior to loading panels 50 in carrier 100 (or unloading panels 50 from carrier 100), lid 20 is moved to its open configuration (see, e.g., FIGS. 1E-1G). When lid 20 is open, all trays 30 except the bottom-most tray 30 can be lifted to allow enough clearance to place a panel 50 on the tray below (or remove a panel 50 from the tray). For example, in the configuration of FIG. 1F, a panel 50 may be placed on (or removed from) the top-most tray 30, and in the configuration of FIG. 1G, a panel 50 may be placed on (or removed from) the bottom-most tray 30. Lid 20 may be opened and trays 30 may be lifted in any manner (e.g., manually or using an automated apparatus). To open lid 20, the lid is slid with respect to housing 10 in the direction of arrow A in FIG. 1A. Pins 24 on to of lid 20 may be pushed in the direction of arrow A to move lid 20 to its open configuration. When pins 24 are moved in this direction (e.g., −Z direction in FIG. 1A), pins 22 positioned in the inclined slots 12 of side-wall 14 slides up the inclined slots 12 to allow the lid to move to its open configuration. With lid 20 in its open configuration, a tray 30 may be separated from the trays below by lifting the tray in the vertical direction (e.g., in the +Y direction of FIG. 1A).

In some embodiments, tilter 200 (see, e.g., FIGS. 3A-3D) may be configured to open lid 20 and lift a tray 30 (along with the trays above it) to allow a panel 50 to be positioned on the tray below. For example, an arm or mechanism of tilter 200 may engage with pins 24 on top of lid 20 and slide the lid (in the direction of arrow A in FIG. 1A) to its open position. To lift a tray 30 in carrier 100, motor-driven pins 212 (see, e.g., FIGS. 3A-3D) of tilter 200 may be horizontally moved (e.g., in the X-direction of FIGS. 1A-1D) to enter carrier 100 through vertical slots 16A and 16B on the opposite side-walls 14 of housing 10 (see, e.g., FIG. 1C) to engage with grooves 42A and 42B (see, e.g., FIGS. 1C, 2A, 2B) on the opposite ends of side-rails 32 and 34 of tray 30, and then moved in the vertical direction (e.g., in the Y-direction of FIGS. 1A-1D) to lift tray 30 (and the trays above) in carrier 100. A panel 50 may then be loaded in the tray below the lifted trays. In some embodiments, a robotic arm may automatically load a panel 50 (see, e.g., FIG. 4) on the tray below the lifted trays.

Figure 2A:
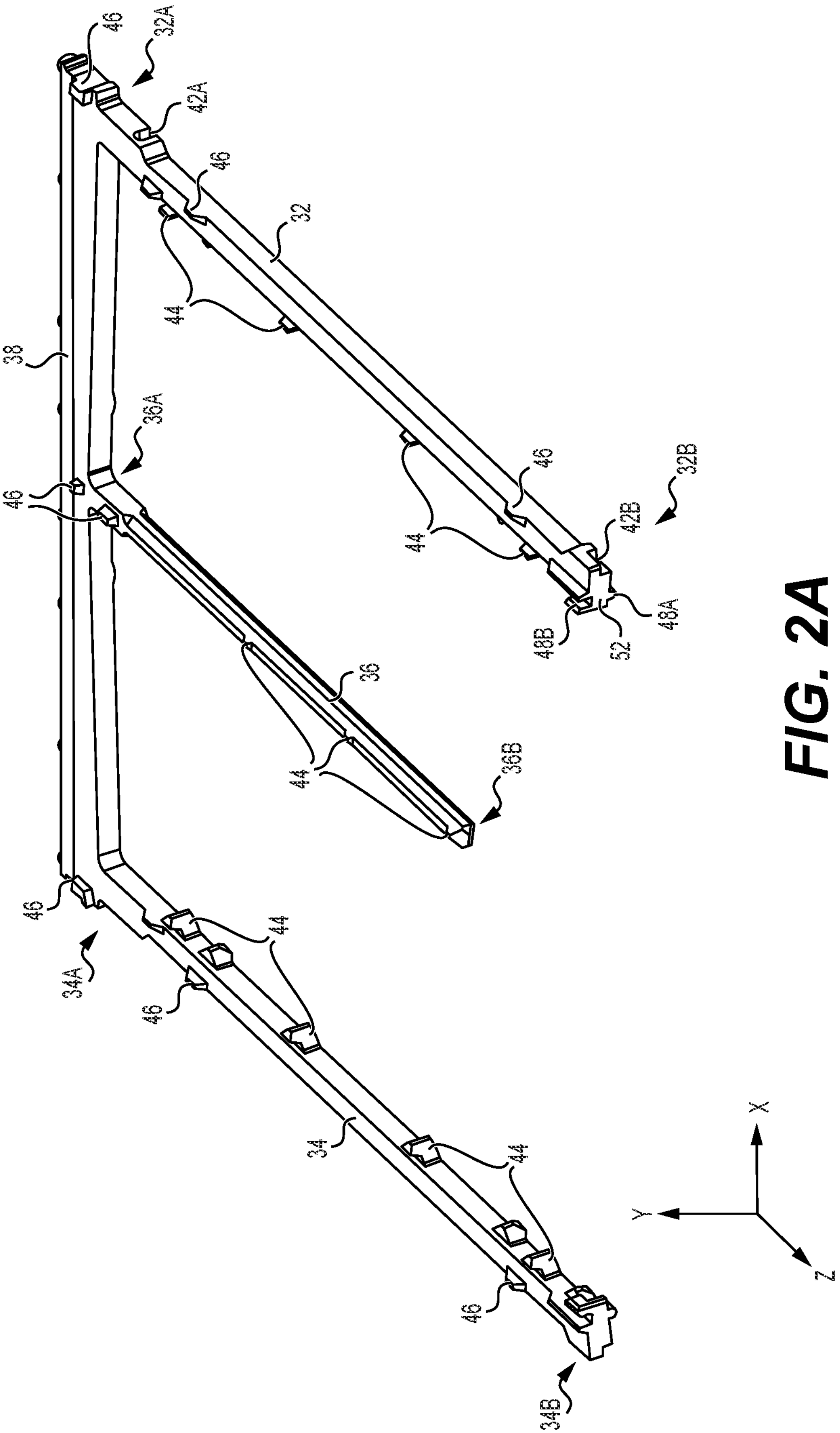
FIGS. 2A-2D illustrate different views of a tray that may be used with the carrier of FIG. 1A.
Figure 2B:
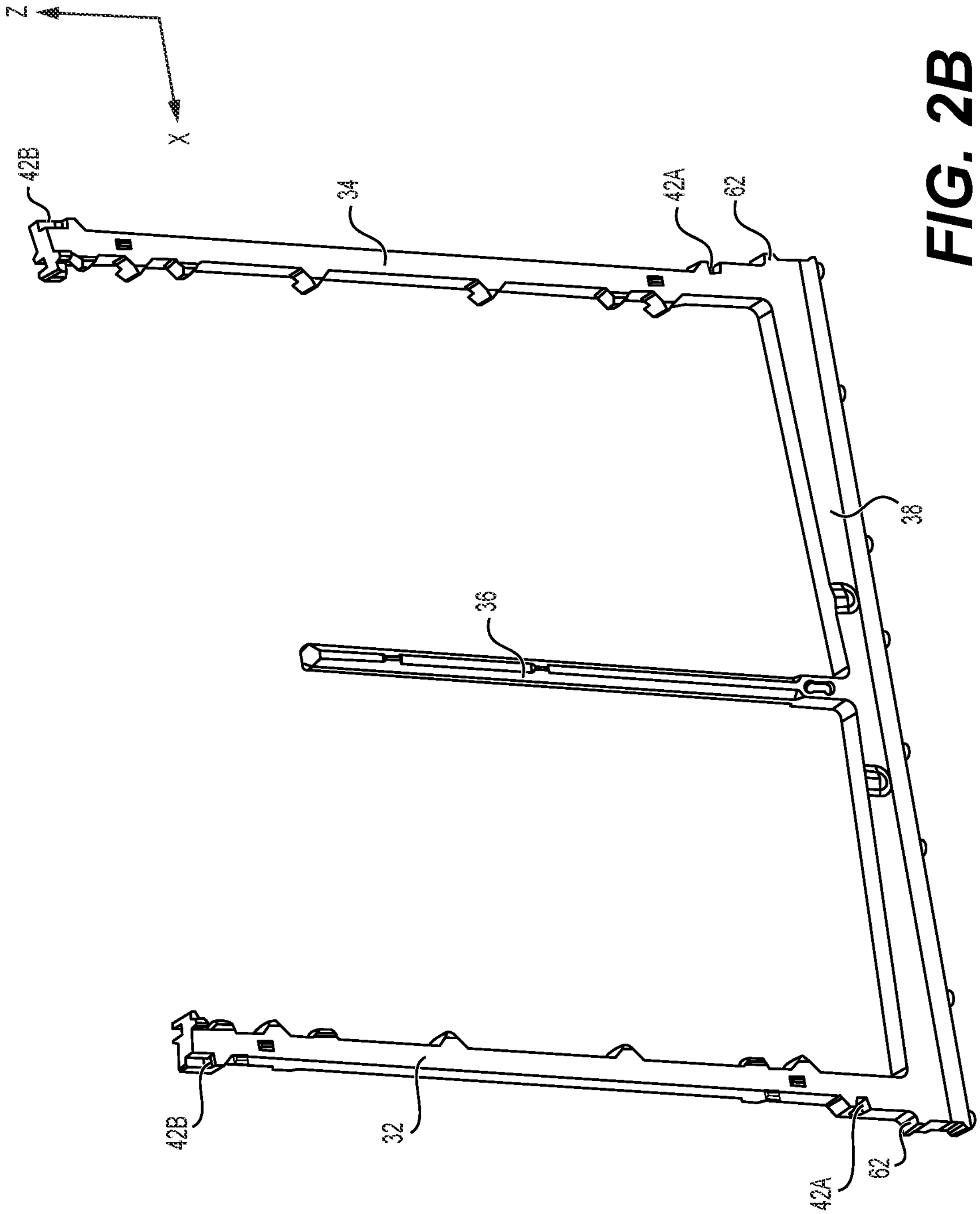
Figure 2C:
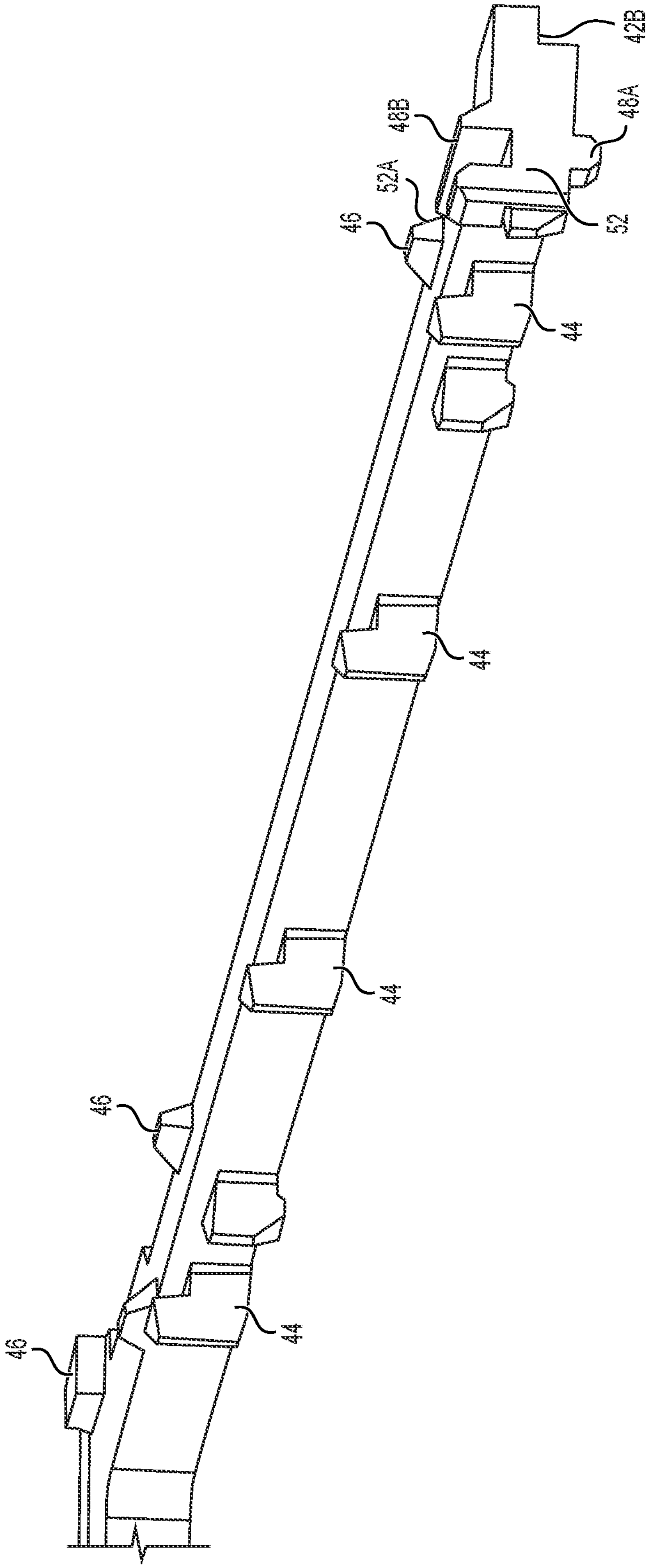

FIGS. 2A-2C illustrate different views of an exemplary tray 30 removed from carrier 100. FIGS. 2A and 2B are perspective views of tray 30 showing the top and bottom surfaces, respectively, of the tray. When tray 30 is positioned in carrier 100, the top surface (illustrated in FIG. 2A) is the surface upon which a panel 50 is positioned, while the bottom surface (illustrated in FIG. 2B) faces a panel 50 supported by the tray below. As best seen in FIGS. 2A and 2B, tray 30 is a generally planar E-shaped structure (e.g., in the XZ plane) with a pair of substantially similar side-rails 32, 34 symmetrically arranged on opposite sides of a middle-rail 36. Side-rails 32, 34 and middle-rail 36 extend from a first end 32A, 34A, 36A to a second end 32B, 34B, 36B. At their first ends 32A, 34A, 36A, the three rails 32, 34, 36 are connected to a cross-rail 38 that extends substantially perpendicular to the three rails 32, 34, 36. And the second ends 32B, 34B, 36B of the three rails 32, 34, 36 may be free ends. In some embodiments, tray 30 may be a unitary or integral component with the four rails 32, 34, 36, 38 formed as one single part.

With reference to FIGS. 2A and 2B, grooves 42A and 42B (that interface with the tray lifting pins 212 of tilter 200) are disposed on (or proximate) the first and second ends of the side rails 32, 34 of tray 30. In some embodiments, groove 42A may be a curved (e.g., substantially semi-circular) groove positioned proximate the first ends 32A, 34A of side-rails 32 and 34, and groove 42B may be a curved groove positioned at the second ends 32B, 34B of side-rails 32 and 34. In some embodiments, these grooves 42A, 42B may be open at the bottom surface and covered at the top surface of the side-rails 32, 34 (see, e.g., FIGS. 2A, 2B). When multiple trays 30 are positioned in housing 10, grooves 42A, 42B of each tray 30 are aligned with, and exposed through, the vertical slots 16A and 16B on the housing side-walls 14 (see FIG. 1C). To lift a tray 30 in housing 10, pins 212 of tilter 200 engage with the grooves 42A, 42B of that tray and moves the tray in the vertical direction (e.g., in the +Y direction of FIG. 1A) to lift that tray and the trays above.

When a panel 50 is supported on a tray 30, the panel 50 rests on posts 44 that extend from the side-rails 32, 34 and middle-rail 36. These posts 44 are positioned such that they contact panel 50 outside of critical process areas of the panel. When supported on tray 30, panel 50 is retained by hard-stop features that do not allow the panel to move laterally into the exclusion zones. In the embodiment of tray 30 illustrated (e.g., in FIGS. 2A-2C), four posts 44 extend upwards (in the +Y-direction) from each side-rail 32, 34 and three posts extend upwards from middle-rail 36. The posts 44 in middle-rail 36 may support the middle of panel 50 in locations dictated by panel processing. In some embodiments, posts 44 in each side-rail 32, 34 and posts 44 in middle-rail 36 may each be equally spaced apart (e.g., in the Z-direction). The described number and spacing of posts 44 is only exemplary. In general, any number of posts 44 may be provided to adequately support a panel 50 on the rails 32, 34, 36.

When multiple trays 30 are stacked in housing 10, tabs 46 (see, e.g., FIGS. 2A, 2C) on each tray 30 may support the tray 30 above it. In some embodiments, as best seen in FIG. 2A, three tabs 46 are provided in each side-rail 32, 34 and two tabs 46 are provided in middle-rail 36. However, this is only exemplary, and any number of tabs 46 may be provided. Additionally, a rib 48A on the bottom surface of a tray 30 may fit into a correspondingly shaped channel 48B on a panel retaining tab 52 of the tray below (see, e.g., FIGS. 1D, 1H, 2A, 2B) to secure the stacked trays 30 together.

Figure 1H:
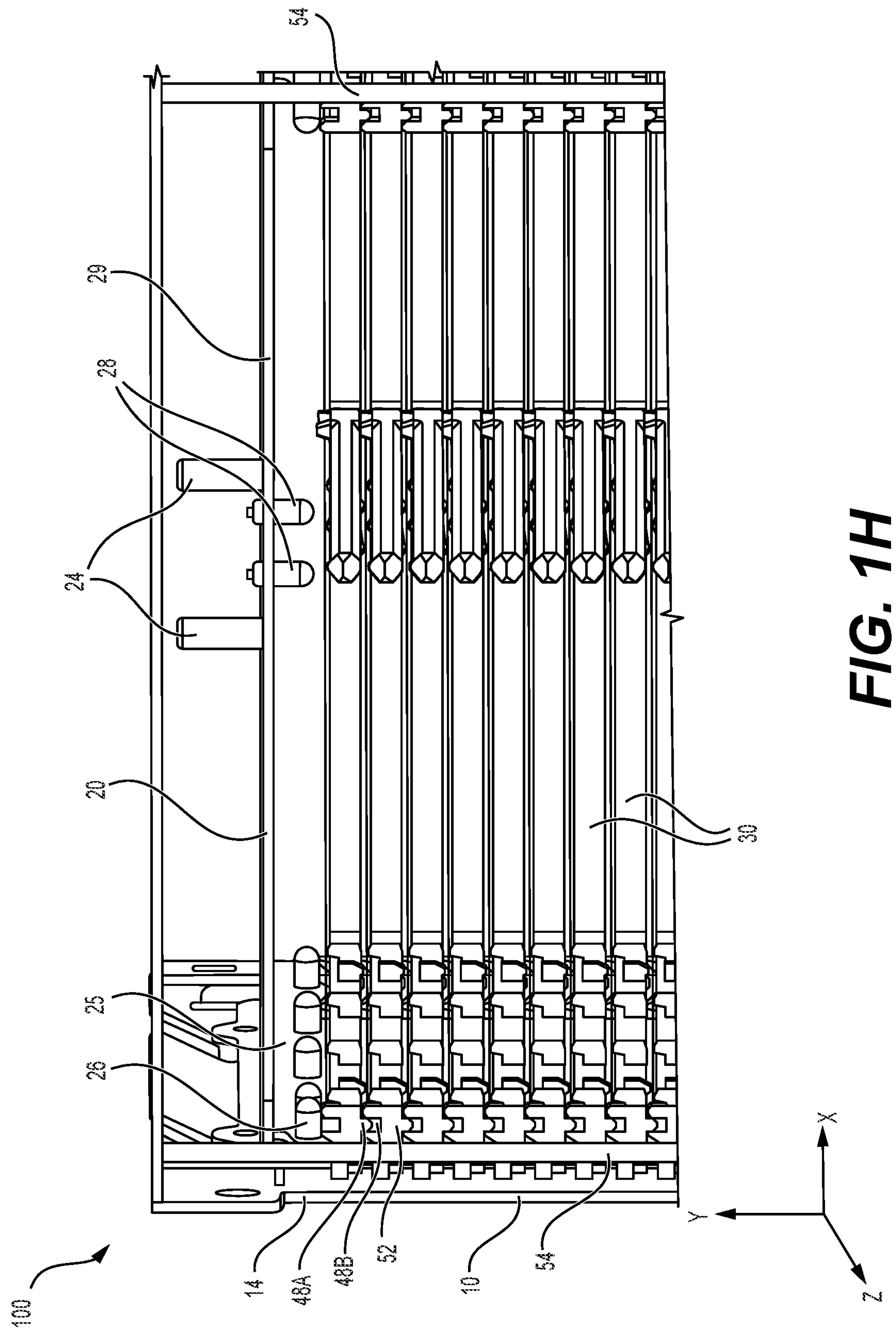

With reference to FIG. 1H, when lid 20 is in the closed configuration, multiple pins 26 attached to opposite side-walls 25 of lid 20 (that extend substantially parallel to side-walls 14 of housing 10) maintain the spacing of the top-most tray from the lid 20 and prevent the tray 30 from moving towards lid 20 (e.g., in the +Y direction of FIG. 1H). In the exemplary embodiment illustrated in FIG. 1H, five pins 26 are arranged (e.g., symmetrically) on each side-wall 25. However, this is only exemplary and a different number of pins 26 may be provided in other embodiments. As best seen in FIG. 1H, one of these pins 26 may contact the raised top surface of panel retaining tab 52 (which defines channel 48B) of the top-most tray 30 (the tray closest to the lid 20) and lock all the trays in place. A clearance may exist between the remaining pins 26 and the top surface of the side-rails 32, 34 to provide a clearance for the movement of the top panel and to retain that panel from moving a significant distance throughout the process. Pins 28 may also be provided on the top surface 29 of lid 20 (that extends substantially parallel to trays 30) such that a clearance is provided for the movement of the top panel.

Figure 2D:
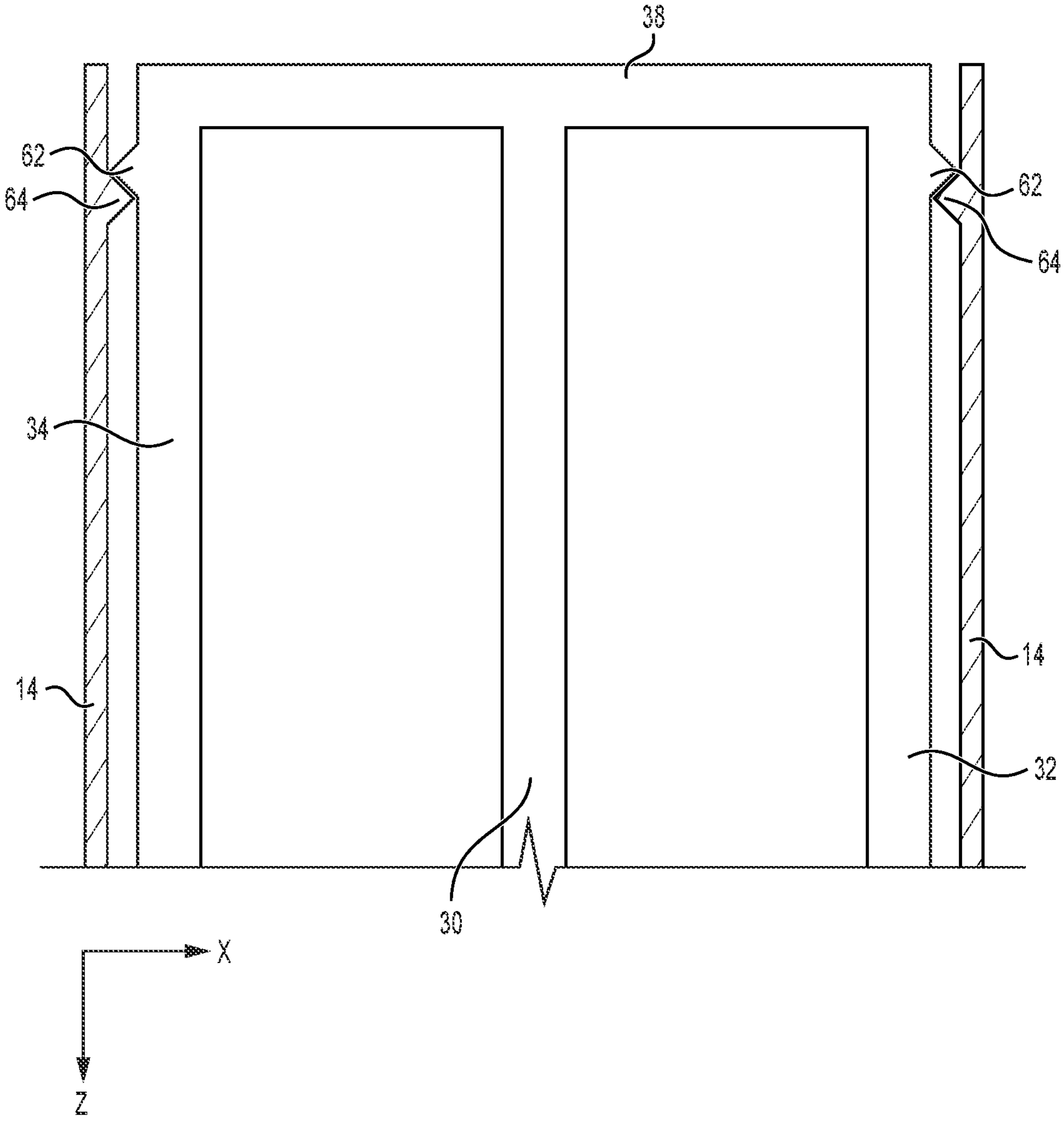

With reference to FIG. 2C, when a panel 50 is supported on tray 30, a back surface 52A of panel retaining tab 52, that faces the front surface of the supported panel, serves as a hard-stop that blocks and prevents the panel from coming out of the housing 10 (i.e., move in the +Z direction of FIG. 1A) (see, e.g., FIG. 1D). When each tray 30 is set down on the one below it, the panels are captured such that they do not fall out of the trays, accounts for thermal expansion, and still allows enough room for fluid flow around each panel. The middle-rail 36 of each tray 30 acts as a stabilizer member that helps in reducing panel flex which may cause panel disengagement from the trays. When a tray 30 is positioned in housing 10, as schematically illustrated in FIG. 2D, a ledge 62 (see also, FIGS. 2A, 2B) formed on the side-rails 32, 34 interfaces with a fin 64 formed on the inner surface of the sidewalls 14 of housing 10 to support the tray 30 in housing 10. Fin 64 may extend along the height (e.g., in Y-direction of FIG. 1A) of the pair of sidewalls 14 such that the ledges 62 of all trays 30 interface with the fin 64 to support these trays 30 in housing 10. With the ledges 62 of each tray 30 engaged with the vertically extending fin 64, the trays 30 can slide on the fin 64 to move relative to each other in the vertical direction (or separate from each other) when lid 20 is open. It should be noted that the fin and ledge arrangement described above is only exemplary. In general, any suitable mechanism may be used to slidably (e.g., in the vertical or Y-direction of FIG. 1A) couple the trays together. For example, in some embodiments, one or more rods coupled to housing 10 and extending parallel to sidewall 14 (e.g., in the +Y direction of FIG. 1A) may pass through aligned holes on the stacked trays 30 slidably couple the trays together.

The outer surface of the opposing sidewalls 14 of housing 10 includes posts 18 configured to engage with an arm (or hook) of a robot (not shown). Although two posts 18 on each sidewall 14 are illustrated in the exemplary embodiment depicted, in general, any number of posts 18 (e.g., one or more pins) may be provided on each side-wall 14. In use, an arm (or hook) of a robot may engage with these posts 18 to pick up a carrier 100 (with trays 30 and panels 50 supported therein) and transport the carrier 100 to a chemical processing station (or between different chemical processing stations). In some embodiments, posts 18 may be designed such that there are 3 positions that the carrier can be held. One position is for the transport robot to move the carrier to the stations, one position is for the nesting of the carrier within the tanks at the processing station, and one position is to allow a spray-lid mechanism to nest on top of the carrier to perform a rinse process. With reference to FIG. 1A, when carrier 100 is picked and transported, the carrier 100 may be oriented such that the sidewalls 14 and lid 20 of the carrier 100 are vertically aligned (e.g., along the Z-axis) with the end marked T positioned vertically above the end marked B.

When carrier 100 is vertically oriented or suspended in the above-described manner, trays 30 and panels 50 within carrier 100 may also be vertically aligned and disposed substantially parallel to each other. In this orientation, ledges 62 (see FIGS. 2A, 2B) of each tray 30 that interfaces with fin 64 (on the inside surface of side-walls 14 of housing 10) may prevent the trays 30 from dropping out of housing 10. Rods 54 extending between lid 20 and the wall of housing 10 opposite lid 20 may also assist in retaining the stacked trays 30 in housing 10. In some chemical processes (e.g., chemical etching of panels, etc.), the suspended carrier 100 may be dipped (or submerged) in a liquid chemical. With reference to FIG. 1A, the liquid may enter housing 10 (e.g., through the open end B of housing 10), flow freely around panels 50 within housing 10, and exit the housing through the top. Multiple slots 56 (see FIG. 1A) may be provided in housing 10 (proximate posts 18) to allow the liquid to easily flow out of the housing. To ensure proper flow characteristics of the liquid chemical within carrier 100, carrier 100 and trays 30 are designed such that the flow of the liquid around panels 50 is uniform and laminar with minimal obstructions. Additionally, in some embodiments, the edges of carrier 100 and/or trays 30 may be rounded or chamfered to minimize liquid entrapment.

As explained previously, the lid 20 may be moved between its closed and open configurations, and each tray 30 may lifted in housing 10 (to load a panel on the tray below) while the lid is in its open configuration in any manner (e.g., manually or using an automated apparatus). In some embodiments, tilter 200 may be used to automatically open the lid and load and unload panels in carrier 100. FIGS. 3A-3D illustrate an exemplary tilter 200 that may be used to automate the loading and unloading of carrier 100. Automating the loading and unloading of panels 50 into carrier 100 may improve the efficiency of loading/unloading process and reduce contamination and accidental damage to the panels (e.g., when the panels are thin and fragile).

With reference to FIGS. 3A-3D, tilter 200 includes a housing 202 that defines a cavity 204 extending therethrough. Cavity 204 may be sized and shaped to support carrier 100 therein (compare, e.g., FIG. 3A with 3C and FIG. 3B with 3D). In other words, the size and shape of cavity 204 may be such that carrier 100 may be received therein without excessive play. For example, when carrier 100 has a rectangular cross-sectional shape, cavity 204 may be a rectangular cavity. Tilter 200 is configured to rotate or tilt housing 202 between a vertical orientation (see, e.g., FIGS. 3A and 3C) and a horizontal orientation (see, e.g., FIGS. 3B and 3D). In the vertical orientation, cavity 204 is vertically aligned (e.g., extends along the Z-axis) and in the horizontal orientation, cavity 204 is horizontally aligned (e.g., extends along the Y-axis).

In an exemplary embodiment, to load panels into a carrier 100, the carrier 100 is loaded into cavity 204 when both carrier 100 and housing 202 are in their vertical orientations. The carrier 100 may then be centered and indexed by tilter 200 to enable accurate positioning of panels in the trays. Actuators of tilter 200 may then rotate or tilt housing 202 (with the carrier 100 in cavity 204) to its horizontal orientation (see FIG. 3D). Once horizontal, an arm of tilter 200 engages with posts 24 on the carrier lid 20 to open the lid. The lid 20 may be opened by applying a force on the posts 24 to slide lid 20 in the +Y-direction (in FIG. 3D). Then, servo-slides of tilter 200 directs pins 212 through vertical slots 16A and 16B of the carrier housing 10. The embodiment of tilter 200 illustrated in FIGS. 3A-3D includes four pins 212, each of which will be directed through one of the four slots 16A, 16B of carrier 100. As explained previously, within the carrier 100, these pins 212 engage with grooves 42A and 42B (see, e.g., FIGS. 1C, 2A, 2B) on the side-rails 32 and 34 of a tray 30 that is to be lifted. Motors coupled to tilter 200 then move the pins 212 up (e.g., in the +Z direction of FIG. 3D) to lift the tray (and the trays above this tray) that pins 212 are engaged with (see, e.g., FIG. 1G). A robotic arm of, for example, a loading robot may then load a panel 50 on the tray below the lifted tray (see, e.g., FIG. 4). The height between the lifted tray and the tray below provides sufficient clearance for the panel to be loaded on the tray. After the panel is loaded, the servo-slide may lower the tray and then retract the pins 212 from the carrier 100. This same process may be repeated to load panels in all the trays of carrier 100.

After loading the panels, posts 24 of the carrier lid 20 may be moved (e.g., in the −Z direction of FIG. 3D) to lower lid 20 on housing 10 of carrier 100 and lock all the trays in place. Side actuators of tilter 200 may the tilt housing 202 (with the loaded carrier in cavity 204) to its vertical orientation (see FIG. 3C). An overhead gantry with J-shaped hooks may then engage with posts 18 on carrier 100. The locators in tilter 200 that centered, indexed, and held the carrier 100 in housing 202 are then released to allow the gantry robot to raise the loaded carrier 100 from tilter 200 and move it freely between different chemical processing stations. The robot gantry may return the carrier 100 to the tilter 200 once the process is completed. In some embodiments, housing 202 of tilter 200 may remain in its vertical orientation until carrier 100 is returned. When carrier 100 is repositioned in cavity 204 of housing 202, the housing may be again tilted (or rotated) to the horizontal configuration and the panels unloaded using a process analogous to that used during loading. For example, lid 20 may be first opened by moving posts 24 (on lid 20) in the Y-direction (in FIG. 3D). Tilter 200 may then direct pins 212 into carrier 100 to engage with grooves 42A and 42B on a tray 30 and lift the tray up (e.g., in the +Z direction of FIG. 3D) to provide clearance between the lifted tray and the tray below. A robotic arm may then remove the panel from the tray below. All the trays may be unloaded in this manner.

Tilter 200 may thus be configured to rotate carrier 100 from a vertical orientation (e.g., FIG. 3C) to a horizontal orientation (e.g., FIG. 3D) and vice versa; move the pins 212 to engage with, and disengage from, a selected tray in carrier 100; lifting the selected tray and the trays above after pins 212 have engaged; engage with, and disengage from, the carrier lid 20; open and close lid 20; center and index carrier 100 in the tilter mechanism; locating pins to locate the carrier in a precise location in the tilter mechanism. In some embodiments, these operations may be achieved using four electric linear actuators and nine pneumatic linear actuators. In some embodiments, each actuator may have sensors to determine its position. Additionally, in some embodiments, tilter 200 may also include sensors to determine if a carrier 100 is located in its cavity 204 or not. In some embodiments, carrier 100 may include RFID tags and tilter 200 may include RFID tag readers to track each carrier as it enters or leaves the system.

Although in the description above, some features were disclosed with reference to specific embodiments, a person skilled in the art would recognize that this is only exemplary, and the features are applicable to all disclosed embodiments. Other embodiments of the apparatus, its features and components, and related methods will be apparent to those skilled in the art from consideration of the disclosure herein.

What is claimed is:

1. A carrier configured to support multiple panels and expose the multiple panels to one or more chemical processes, comprising:

a housing having a pair of opposing sidewalls extending in a first direction;

a plurality of trays stacked between the pair of opposing sidewalls along the first direction, wherein each tray of the plurality of trays is configured to support a panel of the multiple panels thereon; and a lid slidably coupled to the pair of opposing side-walls and configured to be slid on the housing between an open configuration and a closed configuration, wherein the plurality of trays are supported in the housing such that (a) in the closed configuration of the lid, two trays of the plurality of trays are blocked from moving relative to one another in the first direction, and (b) in the open configuration of the lid, the two trays are configured to be moved relative to one another in the first direction.

2. The carrier of claim 1, wherein each sidewall of the pair of sidewalls includes at least one slot inclined with respect to the first direction and at least pin coupled to the lid is positioned in the at least one slot of each sidewall to slidably couple the lid to the pair of sidewalls.

3. The carrier of claim 2, wherein each sidewall includes a pair of slots inclined with respect to the first direction and a pin coupled to the lid is positioned in each slot.

4. The carrier of claim 1, wherein the lid is configured to be slid on the housing in a second direction transverse to the first direction to transform the lid between its open configuration and closed configuration.

5. The carrier of claim 1, wherein the lid includes one or more pins that engage with a first tray of the plurality of stacked trays in the closed configuration of the lid to block the two trays from moving relative to one another in the first direction when the lid is in the closed configuration.

6. The carrier of claim 5, wherein the one or more pins are configured to disengage from the first tray in the open configuration of the lid to allow the two trays to be moved relative to one another in the first direction in the open configuration of the lid.

7. The carrier of claim 1, wherein at least one tray of the plurality of trays includes at least one panel retaining tab configured to block a panel supported by the at least one tray from moving in a second direction transverse to the first direction.

8. The carrier of claim 7, wherein the at least one panel retaining tab includes a rib on its bottom surface and a groove on its top surface, wherein the rib of the at least one tray is positioned in the groove of another tray positioned below the at least one tray.

9. The carrier of claim 1, wherein the plurality of trays includes twelve trays.

10. The carrier of claim 1, wherein each tray of the plurality of trays is a planar E-shaped structure extending in a plane substantially perpendicular to the first direction.

11. The carrier of claim 10, wherein each tray of the plurality of trays includes a cross-rail extending between the pair of opposing sidewalls of the housing and a pair of substantially identical side-rails symmetrically positioned on opposite sides of a center-rail, wherein one end of the pair of side-rails and the center-rail are connected to the cross-rail.

12. The carrier of claim 11, wherein the pair of side-rails and the center-rail each include a plurality of posts projecting in the first direction and configured to support a panel of the multiple panels thereon.

13. The carrier of claim 11, wherein the plurality of posts on each side-rail of the pair of side-rails are equally spaced apart from each other.

14. The carrier of claim 1, wherein each sidewall of the pair of sidewalls includes a pair of slots extending in the first direction and each tray of the plurality of trays includes multiple grooves, wherein a groove of the multiple grooves is visible through each slot of the pair of slots on each side wall.

15. A system for automatically loading panels on a carrier, comprising:

the carrier including, a housing having a pair of opposing sidewalls extending in a first direction;

a plurality of trays stacked between the pair of opposing sidewalls in the first direction, wherein each tray of the plurality of trays is configured to support a panel thereon; and a lid coupled to the pair of opposing sidewalls and configured to be slid on the housing in a second direction transverse to the first direction between an open configuration and a closed configuration, wherein the plurality of trays are supported in the housing such that (a) in the closed configuration of the lid, two trays of the plurality of trays are blocked from moving relative to one another in the first direction, and (b) in the open configuration of the lid, the two trays are configured to be moved relative to one another in the first direction; and a tilter mechanism configured to slide the lid of the carrier between its open and closed configuration, and in the open configuration of the lid, move a first tray of the plurality of trays of the carrier in the first direction relative to a second tray below the first tray and load a panel of the plurality of panels in the second tray.

16. The system of claim 15, wherein each sidewall of the pair of opposing sidewalls of the carrier includes a pair of slots that extend in the first direction, and the tilter mechanism includes a plurality of motor-driven pins configured to enter the carrier through the slots to engage with the first tray and move the first tray in the first direction.

17. The system of claim 15, wherein the tilter mechanism includes a tilter housing defining a rectangular cavity configured to support the carrier therein, and wherein the tilter mechanism is configured to rotate a carrier received in the cavity between a vertical orientation and a horizontal orientation.

* * * * *